(12) United States Patent
Lin et al.

(10) Patent No.: US 11,527,529 B2
(45) Date of Patent: Dec. 13, 2022

(54) ELECTROSTATIC DISCHARGE PROTECTION DEVICE

(71) Applicant: Vanguard International Semiconductor Corporation, Hsinchu (TW)

(72) Inventors: Wen-Hsin Lin, Jhubei (TW); Yeh-Jen Huang, Hsinchu (TW); Chun-Jung Chiu, Tainan (TW); Jian-Hsing Lee, Puzih (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 157 days.

(21) Appl. No.: 17/015,754

(22) Filed: Sep. 9, 2020

(65) Prior Publication Data
US 2022/0077139 A1 Mar. 10, 2022

(51) Int. Cl.
*H01L 27/02* (2006.01)
*H01L 29/66* (2006.01)
*H01L 29/74* (2006.01)
*H01L 29/06* (2006.01)

(52) U.S. Cl.
CPC ...... *H01L 27/0262* (2013.01); *H01L 29/0653* (2013.01); *H01L 29/66393* (2013.01); *H01L 29/7436* (2013.01)

(58) Field of Classification Search
CPC ............. H01L 27/0262; H01L 27/0248; H01L 29/735; H01L 27/082; H01L 29/73; H01L 27/0647; H01L 29/0821; H01L 21/8222
See application file for complete search history.

(56) References Cited

U.S. PATENT DOCUMENTS

2016/0372458 A1* 12/2016 Lai ...................... H01L 29/0808
2021/0175226 A1* 6/2021 Song ................... H01L 27/0277

FOREIGN PATENT DOCUMENTS

TW 202008588 A 2/2020

OTHER PUBLICATIONS

Taiwanese Office Action and Search Report for Taiwanese Application No. 109122188, dated Oct. 6, 2020.

* cited by examiner

*Primary Examiner* — Wasiul Haider
(74) *Attorney, Agent, or Firm* — Birch, Stewart, Kolasch & Birch, LLP (57) ABSTRACT

An electrostatic discharge protection device including a substrate, a first PNP element, a second PNP element, and an isolation region is provided. The substrate has a P-type conductivity. The first and second PNP elements are formed in the substrate. The isolation region isolates the first and second PNP elements.

17 Claims, 7 Drawing Sheets

ELECTROSTATIC DISCHARGE PROTECTION DEVICE

BACKGROUND OF THE INVENTION

Field of the Invention

The invention relates to an electrostatic discharge (ESD) protection device, and more particularly to an ESD protection device that comprises cascaded PNP elements.

Description of the Related Art

As the semiconductor manufacturing process improves, electrostatic discharge (ESD) protection has become one of the most critical reliability issues for integrated circuits (IC). In particular, as semiconductor processing advances into the deep sub-micron stage, scaled-down devices and thinner gate oxides are more vulnerable to ESD stress. Generally, the input/output pads on IC chips need to sustain at least 2 kVolts of ESD stress of high Human Body Mode (HBM) or 200 Volts of Machine Mode. Thus, the input/output pads on IC chips are usually designed to include ESD protection devices or circuits for protecting the core circuit in IC chips from ESD damage.

BRIEF SUMMARY OF THE INVENTION

In accordance with an embodiment of the disclosure, an electrostatic discharge (ESD) protection device comprises a substrate, a first PNP element, a second PNP element, and a first isolation region. The substrate has a P-type conductivity. The first PNP element comprises a first well, a first doped region, and a second doped region. The first well is formed in the substrate and has an N-type conductivity. The first doped region is formed in the first well and has the P-type conductivity. The second doped region is formed in the first well and has the P-type conductivity. The second PNP element comprises a second well, a third doped region, and a fourth doped region. The second well is formed in the substrate and has the N-type conductivity. The third doped region is formed in the second well and has the P-type conductivity. The fourth doped region is formed in the second well and has the P-type conductivity. The first isolation region is formed in the substrate and isolates the first PNP element and the second PNP element.

In accordance with another embodiment of the disclosure, an ESD protection circuit comprises a first PNP element, a second PNP element, and a first NPN element. The first PNP element comprises a first collector, a first emitter and a first base. The first emitter is coupled to a first power source. The second PNP element comprises a second collector, a second emitter and a second base. The second collector is coupled to the first emitter. The second emitter is coupled to a second power source. The first NPN element comprises a third collector, a third emitter and a third base. The third collector is coupled to the second base. The third emitter is coupled to the first base. The third base is coupled to the first power source.

BRIEF DESCRIPTION OF THE DRAWINGS

The disclosure can be more fully understood by referring to the following detailed description and examples with references made to the accompanying drawings, wherein.

DETAILED DESCRIPTION OF THE DISCLOSURE

The present disclosure will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

Figure 1:
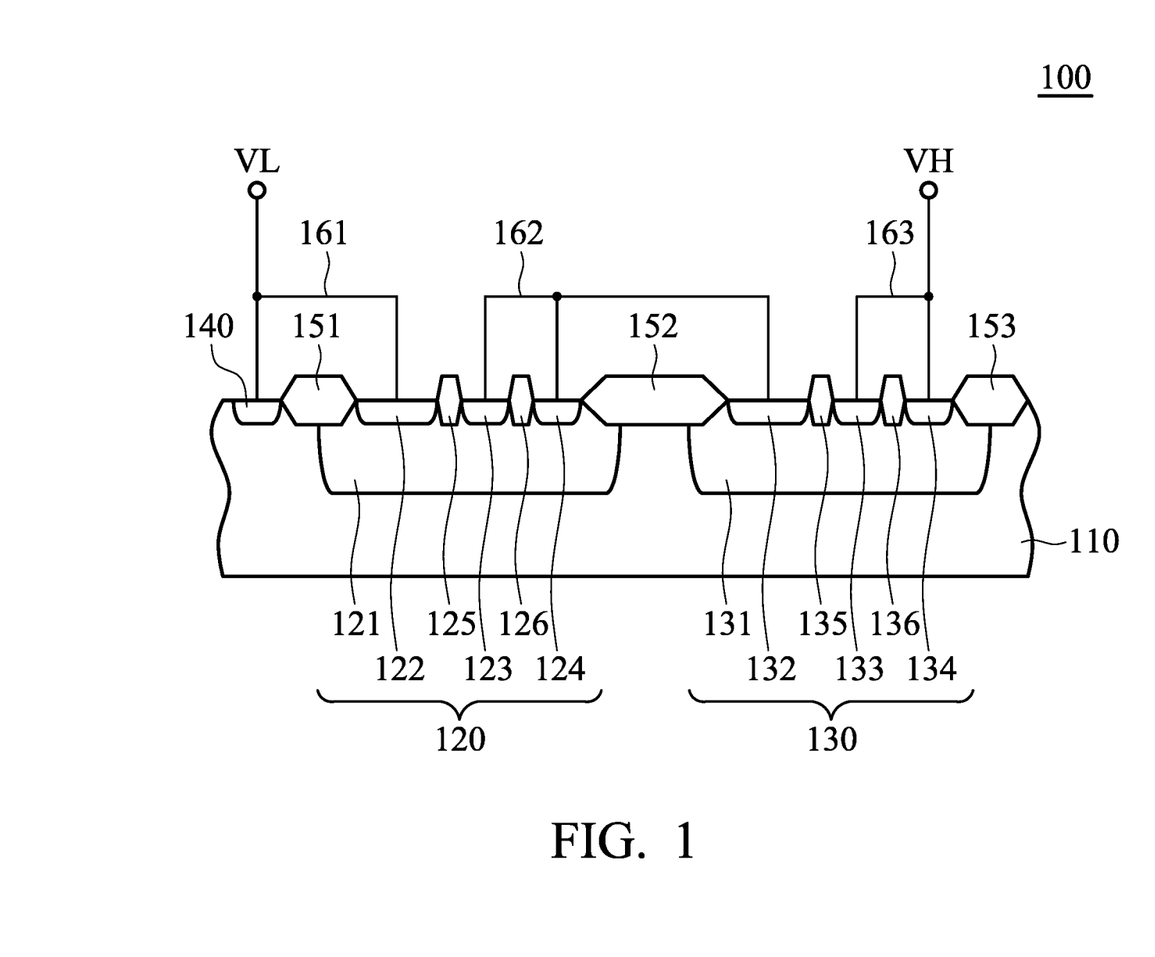
FIG. 1 is a schematic diagram of an exemplary embodiment of an electrostatic discharge protection device, according to various aspects of the present disclosure.

FIG. 1 is a schematic diagram of an exemplary embodiment of an electrostatic discharge (ESD) protection device, according to various aspects of the present disclosure. The ESD protection device 100 comprises a substrate 110, PNP elements 120 and 130. The substrate 110 has a P-type conductivity. In one embodiment, the substrate 110 may include, but is not limited to, a semiconductor substrate such as a silicon substrate. In addition, the semiconductor substrate may include an element semiconductor which may include germanium; compound semiconductor which may include silicon carbide, gallium arsenide, gallium phosphide, indium phosphide, indium arsenide and/or indium antimonide, alloy semiconductor which may include SiGe alloy, GaAsP alloy, AlInAs alloy, AlGaAs alloy, GaInAs alloy, GaInP alloy and/or GaInAsP alloy, or a combination thereof. In addition, the substrate 110 may include semiconductor-on-insulator. In one embodiment, the substrate 110 may be an un-doped substrate. However, in other embodiments, the substrate 110 may be a lightly doped substrate such as a lightly doped P-type substrate.

The PNP element 120 comprises a well 121, doped regions 122 and 123. The well 121 is formed in the substrate 110 and has an N-type conductivity. The present disclosure does not limit how the well 121 is formed in the substrate 110. In one embodiment, the well 121 may be formed by ion implantation. For example, the predetermined region for the well 121 may be implanted with phosphorous ions or arsenic ions to form the well 121. In other embodiments, the well 121 is a high voltage N-type well (HVNW).

The doped regions 122 and 123 are formed in the well 121 and have the P-type conductivity. In this embodiment, each of the doped regions has a higher impurity concentration than the substrate 110. In one embodiment, the P+-type doped regions 122 and 123 may be formed by doping P-type dopants such as boron, gallium, aluminum, indium, or a combination thereof. In one embodiment, the doped region 122 serves as a collector of the PNP element 120, the doped region 123 serves as an emitter of the PNP element 120, and the well 121 serves as a base of the PNP element 120.

In other embodiments, the PNP element 120 further comprises a doped region 124, isolation regions 125 and 126. The doped region 124 has the N-type conductivity and serves as an electrical contact. In this embodiment, the impurity concentration of the doped region 124 is higher than that of the well 121. In one embodiment, the N+-type doped region 124 may be formed by doping N-type dopants. In some embodiment, the doped regions 122-124 are formed by a doping process using a patterned mask (not shown).

The isolation regions 125 and 126 are formed in the surface of the substrate 110 and extends into the well 121. In this embodiment, the isolation region 125 is disposed between the doped regions 122 and 123 to isolate the doped regions 122 and 122. The isolation region 126 is disposed between the doped regions 123 and 124 to isolate the doped regions 123 and 124. In some embodiments, the isolation regions 125 and 126 may be field oxide (FOX). In other embodiments, the isolation regions 125 and 126 may be local oxidation of silicon (LOCOS) or a shallow trench isolation (STI) structure. In other embodiments, the isolation regions 125 and 126 may be made of silicon oxide, silicon nitride, silicon oxynitride, other applicable dielectric materials, or a combination thereof.

The PNP element 130 at least comprises a well 131, doped regions 132 and 133. The well 131 is formed in the substrate 110 and has the N-type conductivity. Since the feature of the well 131 is the same as the feature of the well 121, the description of the well 131 is omitted. In this embodiment, the well 131 does not contact the well 121. In some embodiment, the impurity concentration of the well 131 is similar to the impurity concentration of the well 121, but the disclosure is not limited thereto. In other embodiments, the impurity concentration of the well 131 may be lower than or higher than the impurity concentration of the well 121. For example, one of the wells 121 and 131 is a HVNW, and the other is a general well. In this case, the impurity concentration of the HVNW is lower than the impurity concentration of the general well. Therefore, the HVNW is capable of accepting high voltage.

The doped regions 132 and 133 are formed in the well 131. Each of the doped regions 132 and 133 has the P-type conductivity. In this embodiment, the impurity concentration of each of the doped regions 132 and 133 is higher than the impurity concentration of the substrate 110. In one embodiment, the impurity concentration of each of the doped regions 132 and 133 is similar to the impurity concentration of each of the doped regions 122 and 123. Since the features of the doped regions 132 and 133 are the same as the features of the doped regions 122 and 123, the descriptions of the doped regions 132 and 133 are omitted. In one embodiment, the doped region 132 serves as a collector of the PNP element 130, the doped region 133 serves as an emitter of the PNP element 130, and the well 131 serves as a base of the PNP element 130.

In other embodiment, the PNP element 130 further comprises a doped region 134, isolation regions 135 and 136. The doped region 134 has the N-type conductivity and serves as an electrical contact of the well 131. In this embodiment, the impurity concentration of the doped region 134 is higher than the impurity concentration of the well 131 and is similar to the impurity concentration of the doped region 124. Since the feature of the doped region 134 is the same as the feature of the doped region 124, the description of the doped region 124 is omitted.

The isolation regions 135 and 136 are formed in the surface of the substrate 110 and extends into the well 131. In this embodiment, the isolation region 135 is disposed between the doped regions 132 and 133 to isolate the doped regions 132 and 133. The isolation region 136 is disposed between the doped regions 133 and 134 to isolate the doped regions 133 and 134. Since the features of the isolation regions 135 and 136 are the same as the isolation regions 125 and 126, the descriptions of the features of the isolation regions 135 and 136 are omitted.

In this embodiment, the ESD protection device 100 further comprise an isolation region 152. The isolation region 152 is formed in the surface of the substrate 110 and extends into the wells 121 and 131. The isolation region 152 is configured to isolate the PNP elements 120 and 130. In this case, the isolation region 152 is disposed between the doped regions 124 and 132. In one embodiment, the isolation region 152 directly contacts the doped regions 124 and 132.

In other embodiments, the ESD protection device 100 further comprises a doped region 140. The doped region 140 is formed in the substrate 110 and has the P-type conductivity. In one embodiment, the impurity concentration of the doped region 140 is similar to the impurity concentration of the doped region 122. Since the feature of the doped region 140 is the same as the feature of the doped region 122, the description of the feature of the doped region 140 is omitted. In this embodiment, the doped region 140 serves as an electrical contact of the substrate 110.

In some embodiments, the ESD protection device 100 further comprises isolation regions 151 and 153. The isolation region 151 is formed in the surface of the substrate 110 and extends into the well 121 and the substrate 110. In this embodiment, the isolation region 151 is configured to isolate the doped region 140 and the PNP element 120. Additionally, the isolation region 153 is formed in the surface of the substrate 110 and extends into the well 131 and the substrate 110. The isolation region 153 is configured to isolate the PNP element 130 and other elements (not shown).

The sizes of the isolation regions are not limited in the present disclosure. In one embodiment, the width (in the horizontal direction) of the isolation region 152 is greater than the width of each of the isolation regions 151 and 153. For example, the distance between the doped regions 124 and 132 is longer than the distance between the doped regions 140 and 122. The distance between the doped regions 124 and 132 is also longer than the distance between the doped region 134 and another doped region (not shown). In other embodiments, the width of each of the isolation regions 125, 126, 135, and 136 is smaller than the width of the isolation region 151. In this case, the widths of the isolation regions 125, 126, 135, and 136 are similar to each other.

In one embodiment, the ESD protection device 100 further comprises wires 161-163. The wire 161 is electrically connected to the doped regions 140 and 122. In one embodiment, the wire 161 is coupled to a power source VL. The wire 162 is electrically connected to the doped regions 123, 124, and 132. The wire 163 is electrically connected to the doped regions 133 and 134. In one embodiment, the wire 161 is coupled to a power source VH. In an normal operation (no ESD event), the power source receives a high operation voltage, and the power source VL receives a low operation voltage, such as a ground voltage.

When an ESD event occurs in the power source VH and the power source VL is coupled to ground, the PNP elements 130 and 120 are turn on in sequence. Therefore, an ESD current from the power source VH passes through the doped region 133, the well 131, the doped regions 132 and 123, the well 121, and the doped region 122 to the power source VL. At this time, since the voltage of the well 131 is increased, a current enters the substrate 110 so that the voltage of the substrate 110 is increased. Therefore, an NPN element between the PNP elements 130 and 120 is turned. The NPN element comprises P-type substrate. In this case, the wells 131, 121 and the substrate 110 constitute the NPN element comprising the P-type substrate. The well 131 serves as a collector of the NPN element comprising the P-type substrate. The well 121 serves as an emitter of the NPN element comprising the P-type substrate. The substrate 110 serves as a base of the NPN element comprising the P-type substrate. Since the NPN element comprising the P-type substrate is turned on, the resistances of the turn-on resistors of the PNP elements 130 and 120 are reduced. Therefore, the ESD protection device 100 is capable of accepting more current. Furthermore, the holding voltage of the ESD protection device 100 is increased to avoid latching up the ESD protection device 100 in an normal operation. Additionally, the NPN element comprising the P-type substrate may be a parasitic element or an NPN element generated by doping, but the disclosure is not limited thereto.

Figure 2:
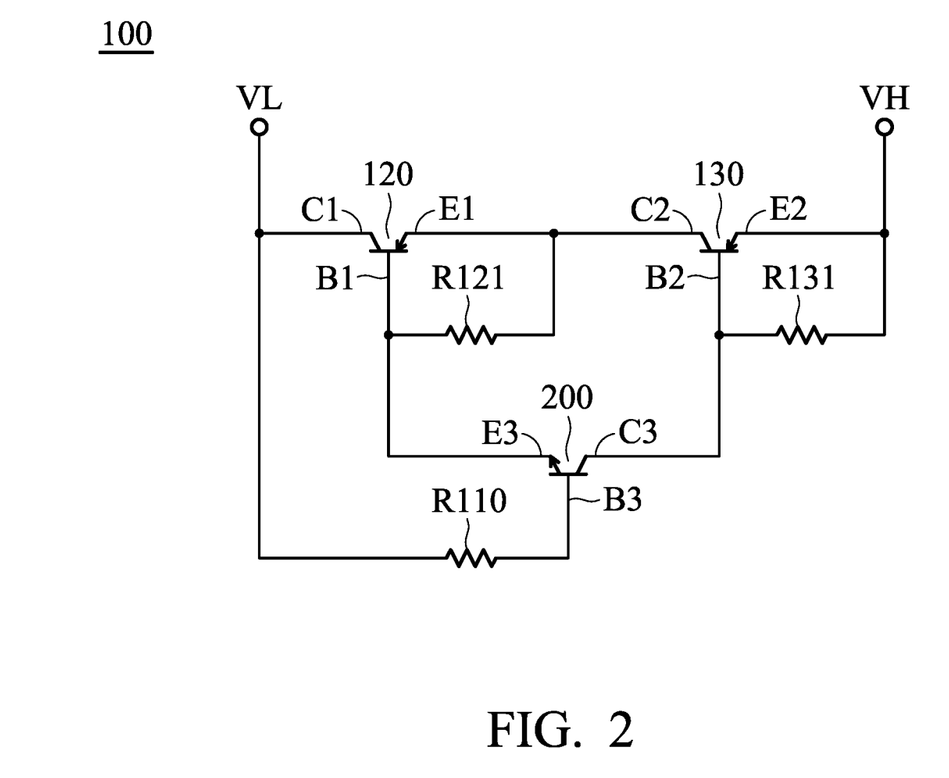
FIG. 2 is an equivalent circuit of an exemplary embodiment of the electrostatic discharge protection device of FIG. 1.

FIG. 2 is an equivalent circuit of an exemplary embodiment of the electrostatic discharge protection device of FIG. 1. As shown in FIG. 2, the ESD protection device 100 comprises PNP elements 120, 130 and an NPN element 200 which comprises a P-type substrate. The emitter E1 of the PNP element 120 is the doped region 123 shown in FIG. 1. The collector C1 of the PNP element 120 is the doped region 122 shown in FIG. 1. The base B1 of the PNP element 120 is the well 121 shown in FIG. 1. In this embodiment, a resistor R12 is disposed between the emitter E1 and the base B1 of the PNP element 120. In this case, the resistor R121 is an equivalent resistor of the well 121. Additionally, the collector C1 of the PNP element 120 is electrically connected to the power source VL via a wire (e.g., the wire 161 shown in FIG. 1).

The emitter E2 of the PNP element 130 is the doped region 133 shown in FIG. 1. The collector C2 of the PNP element 130 is the doped region 132 shown in FIG. 1. The base B2 of the PNP element 130 is the well 131 shown in FIG. 1. In this embodiment, a resistor R131 is disposed between the emitter E2 and the base B2 of the PNP element 130. In this case, the resistor R131 is an equivalent resistor of the well 131. Additionally, the collector C2 of the PNP element 130 is electrically connected to the emitter E1 of the PNP element 120 via a wire (e.g., the wire 162 shown in FIG. 1). The emitter E2 of the PNP element 130 is electrically connected to the power source VH via a wire (e.g., the wire 163 shown in FIG. 1).

Since the well 121 of FIG. 1 serves as the emitter E3 of the NPN element 200 comprising the P-type substrate, it can be regarded as the emitter E3 of the NPN element 200 comprising the P-type substrate electrically connected to the base B1 of the PNP element 120. Furthermore, since the well 131 shown in FIG. 1 serves as the collector C3 of the NPN element 200 comprising the P-type substrate, it can be regarded as the collector C3 of the NPN element 200 comprising the P-type substrate is electrically connected to the base B2 of the PNP element 130. In this embodiment, a resistor R110 is disposed between the base B3 of the NPN element 200 comprising the P-type substrate and the power source VL. In this case, the resistor R110 is an equivalent resistor of the substrate 110.

When an ESD event occurs in the power source VH and the power source VL is coupled to ground, since the voltage of the emitter E2 of the PNP element 130 is increased, the PNP element 130 is turned on. Next, the voltage of the emitter E1 of the PNP element 120 is increased so that the PNP element 120 is turned on. Therefore, an ESD current from the power source VH passes through the PNP elements 130 and 120 to the power source VL. At this time, since the PNP elements 130 and 120 are turned on, the NPN element 200 comprising the P-type substrate is also turned on. Therefore, the equivalent resistances of the turned-on PNP elements 130 and 120 are reduced so that the ESD protection device 100 has a high holding voltage.

Figure 3:
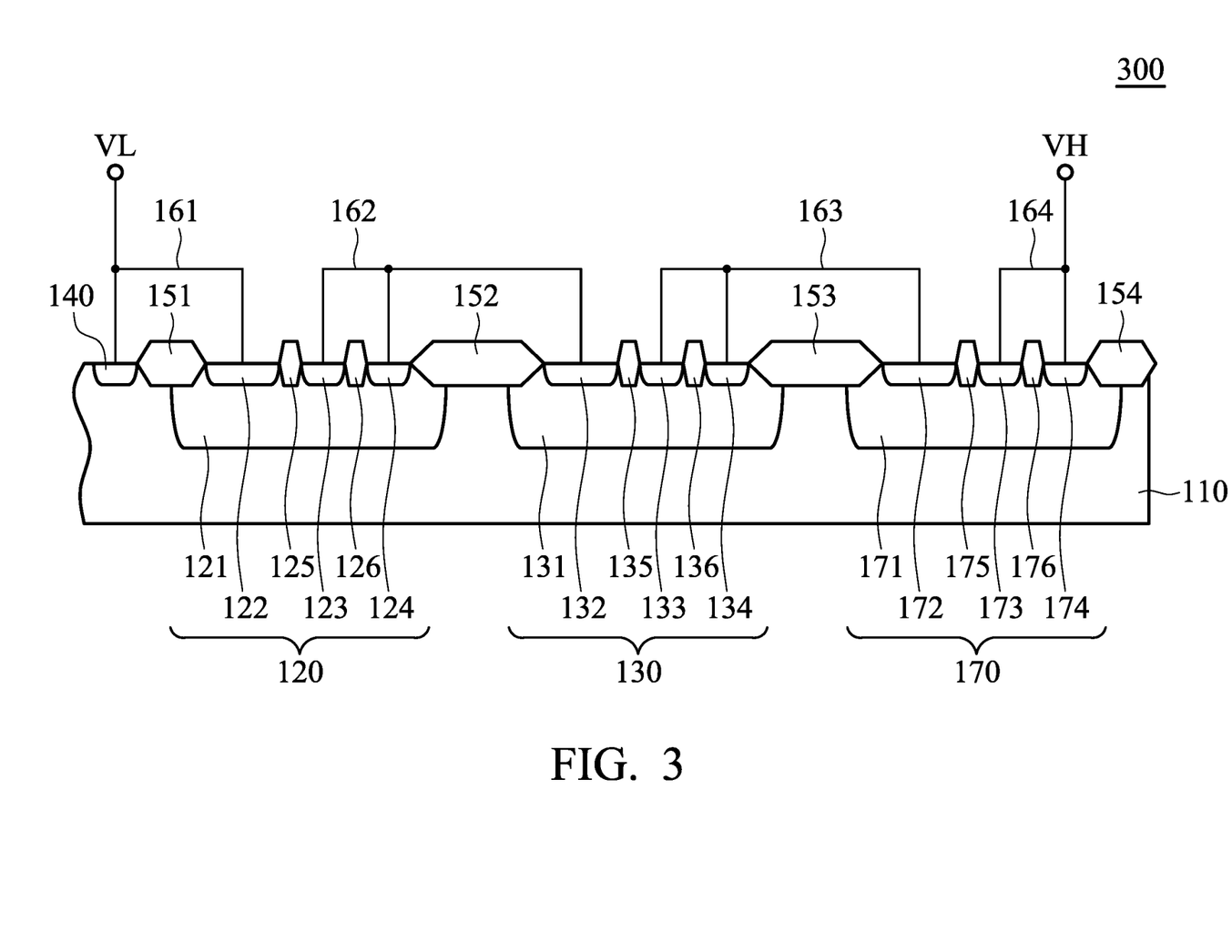
FIG. 3 is a schematic diagram of another exemplary embodiment of the electrostatic discharge protection device, according to various aspects of the present disclosure.

FIG. 3 is a schematic diagram of another exemplary embodiment of the electrostatic discharge protection device, according to various aspects of the present disclosure. FIG. 3 is similar to FIG. 1 exception that the ESD protection device 300 further comprises a PNP element 170. The PNP element 170 comprises a well 171, doped regions 172 and 173. The well 171 is formed in the substrate 110 and has the N-type conductivity. Since the feature of the well 171 is the same as the feature of the well 121, the description of the feature of the well 171 is omitted. In this embodiment, the isolation region 153 isolates the wells 131 and 171. In some embodiments, the impurity concentrations of the wells 121, 131 and 171 are the same, but the disclosure is not limited thereto. In other embodiments, the impurity concentration of one of the wells 121, 131, and 171 may be lower than or higher than the impurity concentration of another of the wells 121, 131, and 171. For example, one of the wells 121, 131, and 171 is a HVNW, and another of the wells 121, 131, and 171 is not a HVNW.

The doped regions 172 and 173 are formed in the well 171. The doped regions 172 and 173 have the P-type conductivity. In this embodiment, the impurity concentration of each of the doped regions 172 and 173 is higher than the impurity concentration of the substrate 110. In one embodiment, the impurity concentrations of the doped regions 172 and 173 are the same as the impurity concentrations of the doped regions 122 and 123. Since the features of the doped regions 172 and 173 are the same as the features of the doped regions 122 and 123, the descriptions of the features of the doped regions 172 and 173 are omitted. In this embodiment, the doped region 172 serves as a collector of the PNP element 170, the doped region 173 serves as an emitter of the PNP element 170, and the well 171 serves as a base of the PNP element 170.

In other embodiments, the PNP element 170 further comprises a doped region 174 and isolation regions 175 and 176. The doped region 174 is formed in the well 171 and has the N-type conductivity. In one embodiment, the impurity concentration of the doped region 174 is similar to the impurity concentration of the doped region 124. Since the feature of the doped region 174 is the same as the feature of the doped region 124, the description of the feature of the doped region 174 is omitted. In this embodiment, the doped region 174 serves as an electrical contact of the well 171.

The isolation regions 175 and 176 are formed in the surface of the substrate 110 and extends into the well 171. In this embodiment, the isolation region 175 is disposed between the doped regions 172 and 173 to isolate the doped regions 172 and 173. The isolation region 176 is disposed between the doped regions 173 and 174 to isolate the doped regions 173 and 174. Since the features of the isolation regions 175 and 176 are the same as the features of the isolation regions 125 and 126, the descriptions of the features of the isolation regions 175 and 176 are omitted.

In this embodiment, the isolation region 153 is configured to isolate the PNP elements 130 and 170. In this case, the isolation region 153 is disposed between the doped regions 134 and the 172. In one embodiment, the isolation region 153 directly contacts the doped regions 134 and 172. In other embodiments, the ESD protection device 300 further comprises an isolation region 154. The isolation region 154 is formed in the surface of the substrate 110 and extends into the well 171 and the substrate 110. The isolation region 154 is configured to isolate the PNP element 170 and other elements (not shown). The sizes of the isolation regions 151-154 are not limited in the present disclosure. In one embodiment, the width of the isolation region 154 is similar to the width of the isolation region 151. In some embodiments, the widths of the isolation regions 152 and 153 may be similar to each other and greater than the widths of the isolation regions 151 and 154. In this case, the widths of the isolation regions 125, 126, 135, 136, 175, and 176 may be similar to each other and may be less than the width of the isolation region 151.

In one embodiment, the ESD protection device 300 further comprises a wire 164. The wire 164 is electrically connected to the doped regions 173 and 174 and coupled to the power source VH. Additionally, the wire 163 is electrically connected to the doped regions 133, 134, and 172. In this embodiment, the wires 161-164 are configured to cascade the PNP elements 120, 130 and 170 in series. With increase of the number of the cascaded elements, the trigger voltage of the ESD protection device 300 is increased. Therefore, the ESD protection device 300 does not be triggered in a normal operation (no ESD event). The number of the PNP elements is not limited in the present disclosure. In other embodiments, the ESD protection device 300 comprises more PNP elements.

When an ESD event occurs in the power source VH and the power source VL is coupled to ground, the PNP elements 170, 130 and 120 are turned on in sequence. Therefore, an ESD current passes through the PNP elements 170, 130, and 120 to the power source VL. In this embodiment, a first NPN element which comprises the P-type substrate 110 is disposed between the PNP elements 170 and 130, a second NPN element which comprises the P-type substrate 110 is disposed between the PNP elements 130 and 120, and a third NPN element which comprises the P-type substrate 110 is disposed between the PNP elements 170 and 120. In this case, when the PNP elements 170, 130, and 120 are turned on, the first NPN element between the PNP elements 170 and 130 and the third NPN element between the PNP elements 170 and 120 are also turned on.

In this embodiment, the first NPN element which comprises the P-type substrate 110 is constituted by the wells 171 and 131 and the substrate 110. The well 171 serves as the collector of the first NPN element comprising the P-type substrate. The well 131 serves as the emitter of the first NPN element comprising the P-type substrate. The substrate 110 serves as the base of the first NPN element comprising the P-type substrate. Additionally, the second NPN element comprising the P-type substrate is constituted by the wells 131, 121, and the substrate 110. In this case, the well 131 serves as the collector of the second NPN element comprising the P-type substrate. The well 121 serves as the emitter of the second NPN element comprising the P-type substrate. The substrate 110 serves as the base of the second NPN element comprising the P-type substrate. The third NPN element comprising the P-type substrate is constituted by the wells 171, 121 and the substrate 110. In this case, the well 171 serves as the collector of the third NPN element comprising the P-type substrate. The well 121 serves as the emitter of the third NPN element comprising the P-type substrate. The substrate 110 serves as the base of the third NPN element comprising the P-type substrate.

When the PNP elements 170, 130, and 120 are turned on, the first NPN element comprising the P-type substrate reduces the equivalent resistance of the turned-on PNP elements 170 and 130, and the third NPN element comprising the P-type substrate reduces the equivalent resistance of the turned-on PNP elements 170 and 120. Therefore, the ESD protection device 300 has a high holding voltage and can accept a large current.

Figure 4:
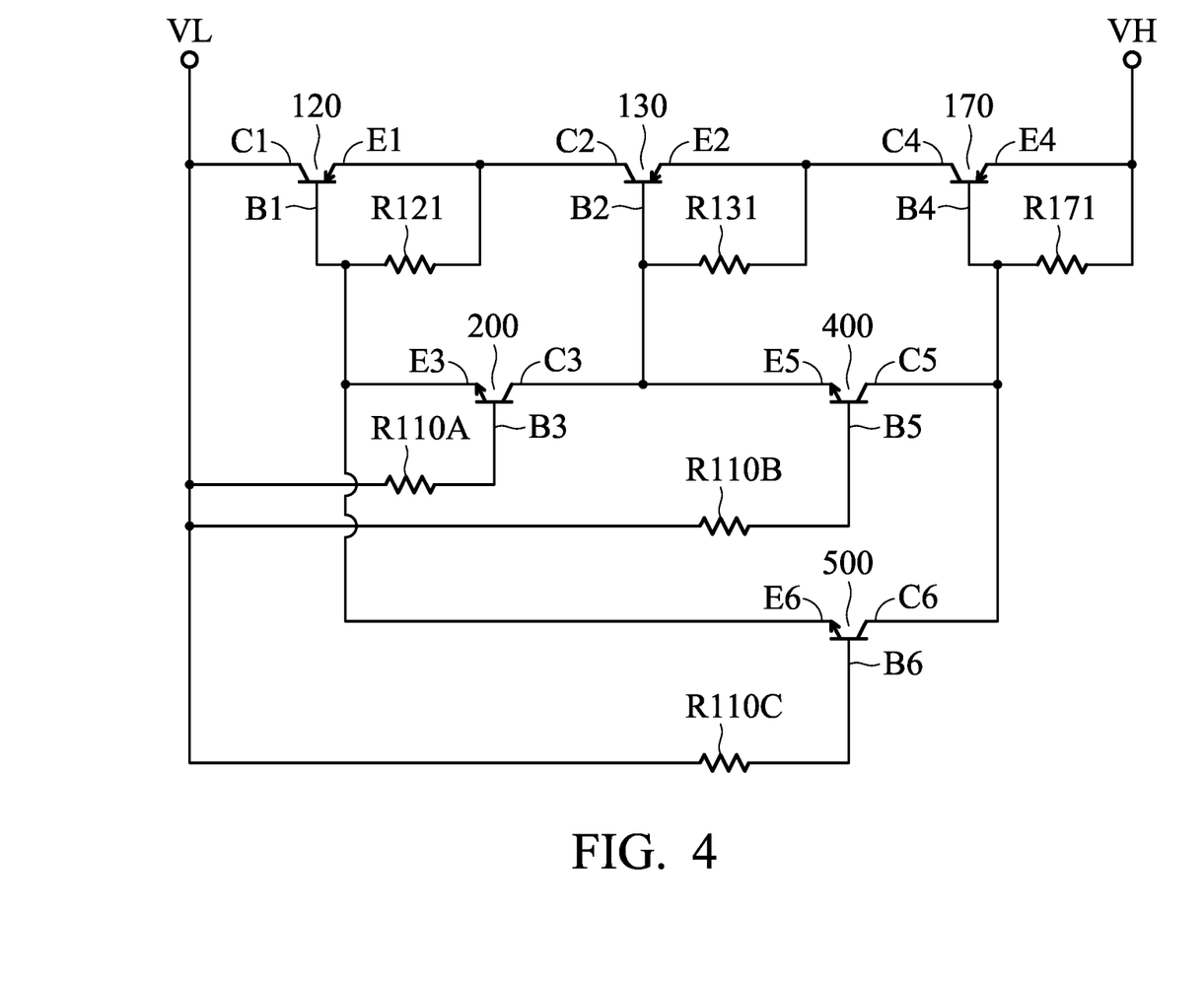
FIG. 4 is an equivalent circuit of an exemplary embodiment of the electrostatic discharge protection device of FIG. 3.

FIG. 4 is an equivalent circuit of an exemplary embodiment of the electrostatic discharge protection device of FIG. 3. The ESD protection device 300 comprises PNP elements 120, 130, 170, and NPN elements 200, 400 and 500. Each of the NPN elements 200, 400 and 500 comprises the P-type substrate. Since the features of the PNP elements 120 and 130 and the NPN element 200 comprising the P-type substrate of FIG. 4 are the same as the features of the PNP elements 120 and 130 and the NPN element 200 comprising the P-type substrate of FIG. 2, the descriptions of the features of the PNP elements 120 and 130 and the NPN element 200 comprising the P-type substrate of FIG. 4 are omitted.

In this embodiment, the emitter E4 of the PNP element 170 is the doped region 173 of FIG. 3. The collector C4 of the PNP element 170 is the doped region 172 of FIG. 3. The base B4 of the PNP element 170 is the well 171 of FIG. 3. In this embodiment, a resistor R171 is disposed between the emitter E4 and the base B4 of the PNP element 170. In this case, the resistor R171 is an equivalent resistor of the well 171. Additionally, the collector C4 of the PNP element 170 is electrically connected to the emitter E2 of the PNP element 130 via a wire (e.g., the wire 163 of FIG. 3). The emitter E4 of the PNP element 170 is electrically connected to the power source VH via a wire (e.g., the wire 164 of FIG. 3).

Since the well 131 of FIG. 3 serves as the emitter E5 of the NPN element 400 comprising the P-type substrate, it can be regarded as the emitter E5 of the NPN element 400 comprising the P-type substrate is electrically connected to the base B2 of the PNP element 130. Furthermore, the well 171 of FIG. 3 serves as the collector C5 of the NPN element 400 comprising the P-type substrate, it can be regarded as the collector C5 of the NPN element 400 comprising the P-type substrate is electrically connected to the base B4 of the PNP element 170. In this embodiment, a resistor R110B is disposed between the base B5 of the NPN element 400 comprising the P-type substrate and the power source VL. In this case, the resistor R110B is the equivalent resistor of the equivalent resistance.

Since the well 121 of FIG. 3 serves as the emitter E6 of the NPN element 500 comprising the P-type substrate, it can be regarded as the emitter E6 of the NPN element 500 comprising the P-type substrate is electrically connected to the base B1 of the PNP element 120. Furthermore, the well 171 of FIG. 3 serves as the collector C6 of the NPN element 500 comprising the P-type substrate, it can be regarded as the collector C6 of the NPN element 500 comprising the P-type substrate is electrically connected to the base B4 of the PNP element 170. In this embodiment, a resistor R110C is disposed between the base B6 of the NPN element 500 comprising the P-type substrate and the power source VL. In this case, the resistor R110C is the equivalent resistor of the equivalent resistance.

In this embodiment, since the distance between the NPN element 400 comprising the P-type substrate and the power source VL is longer than the distance between the NPN element 200 comprising the P-type substrate and the power source VL, the resistance of the resistor R110B is higher than the resistance of the resistor R110A. Similarly, since the distance between the NPN element 500 comprising the P-type substrate and the power source VL is longer than the distance between the NPN element 200 comprising the P-type substrate and the power source VL, the resistance of the resistor R110C is higher than the resistance of the resistor R110A. In one embodiment, the impurity concentration of the substrate 110 can be adjusted to control the resistances of the resistors R110A, R110B, and R110C. In another embodiment, the voltages of the resistors R110B and R11C are less than 0.7V so that the NPN elements 400 and 500 comprising the P-type substrate are turned on.

Since the voltage of the emitter E4 of the PNP element 170 is increased, the PNP element 170 is turned on when an ESD event occurs in the power source VH and the power source VL is coupled to ground. Next, the voltage of the emitter E2 of the PNP element 130 is increased so that the PNP element 130 is turned on after the PNP element 170 is turned on. At this time, the voltage of the emitter E1 of the PNP element 120 is increased so that the PNP element 120 is also turned on. Therefore, an ESD current from the power source VH passes through the PNP elements 170, 130, and 120 to the power source VL. At this time, since the PNP elements 170, 130, and 120 are turned on, the NPN elements 400 and 500 which comprise the P-type substrate are turned on. Therefore, the equivalent resistances of the turned-on PNP elements 170, 130, and 120 are reduced so that the ESD protection device 300 has a high holding voltage.

Figure 5A:
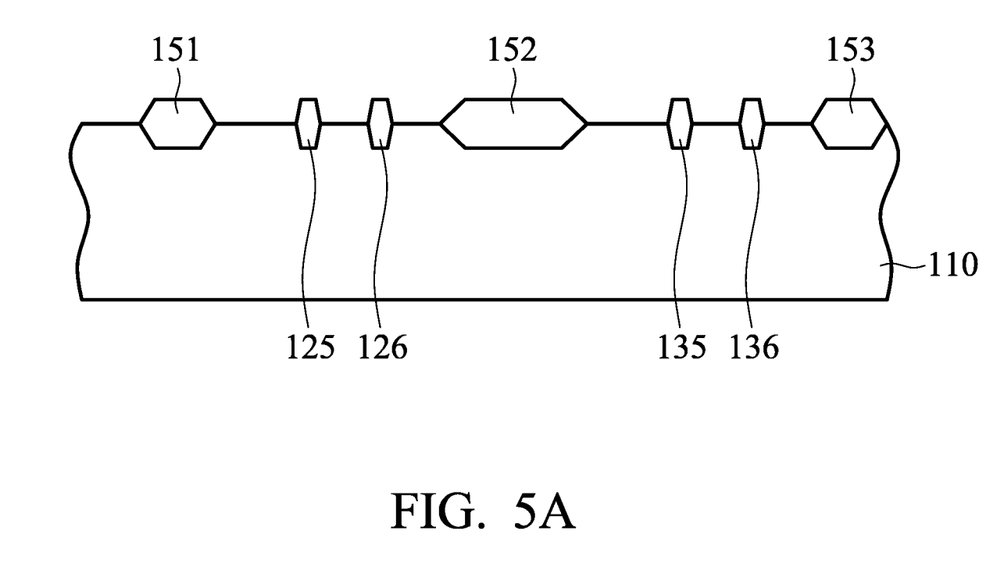
FIGS. 5A~5C are cross-sectional views illustrating the method for forming the electrostatic discharge protection device of one embodiment of the invention.
Figure 5B:
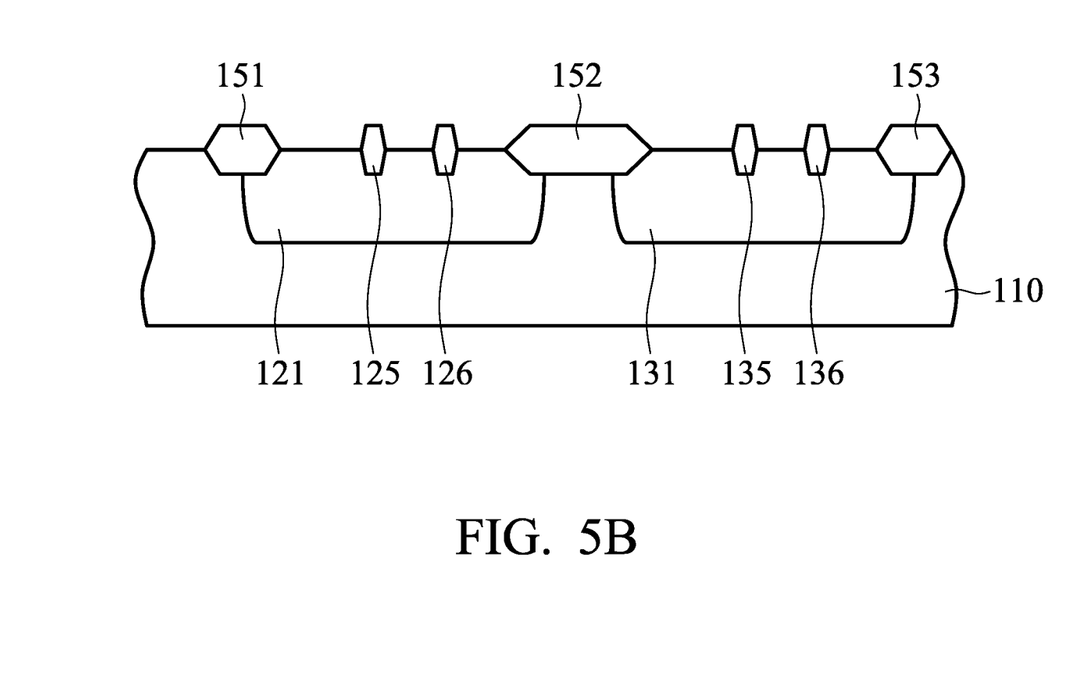
Figure 5C:
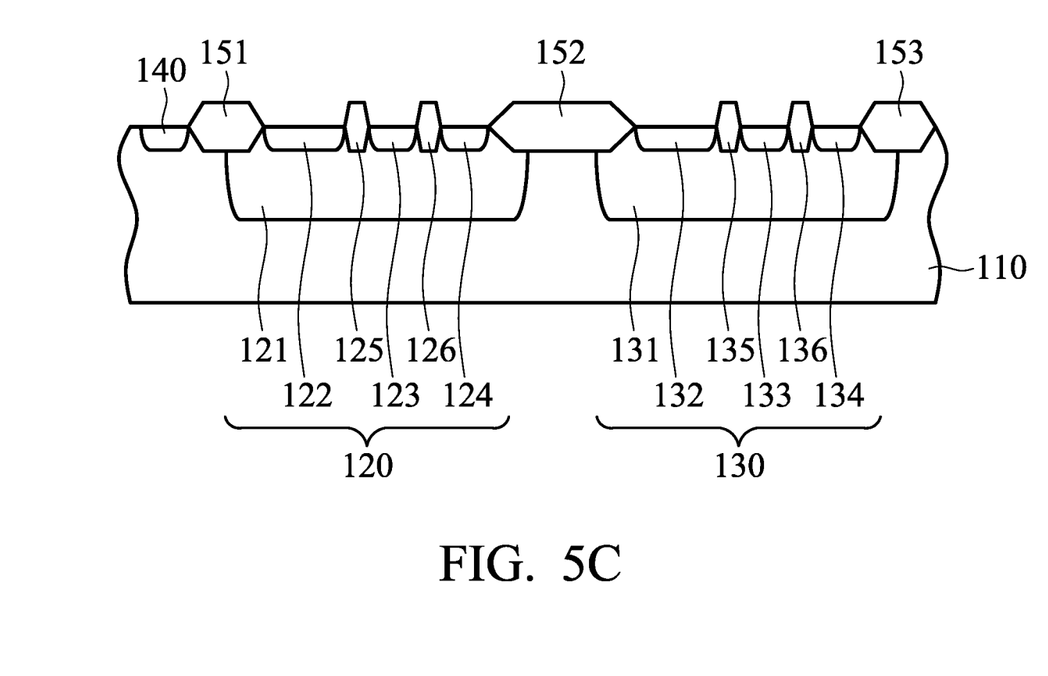

FIGS. 5A~5C are cross-sectional views illustrating the method for forming the electrostatic discharge protection device of one embodiment of the invention. Referring to FIG. 5A, first, a substrate 110 is provided. In one embodiment, the substrate 110 may comprise a silicon-on-insulator (SOI) substrate, a bulk silicon substrate, or a substrate having a silicon epitaxy layer thereon. In this embodiment, the substrate 110 has the P-type conductivity.

Next, the isolation regions 151-153 are formed in the substrate 110 for defining the positions of the PNP elements 120 and 130. Furthermore, the isolation regions 125, 126, 135 and 136 are formed in the substrate 110. In this embodiment, the isolation regions 125, 126, 135 and 136 are not limited to the example of the field oxide layers, and other isolation structures, such as shallow trench isolation structures, may be used. In one embodiment, the size of the isolation region 152 may be larger than the sizes of the isolation regions 151 and 153. In this case, each of the sizes of the isolation regions 151 and 153 is larger than each of the sizes of the isolation regions 125, 126, 135 and 136. The isolation regions 125, 126, 135 and 136 are all a similar size.

Referring to FIG. 5B, the wells 121 and 131 are formed in the substrate 110. The well 121 is disposed between the isolation regions 151 and 152, and the well 131 is disposed between the isolation regions 152 and 153. In this embodiment, the isolation region 152 isolates the wells 121 and 131. In one embodiment, the well 121 extends below the isolation regions 151 and 152. Therefore, the isolation regions 151 and 152 overlap a portion of the well 121. Similarly, the well 131 extends below the isolation regions 152 and 153. Therefore, the isolation regions 152 and 153 overlap a portion of the well 131. In this embodiment, each of the wells 121 and 123 has the N-type conductivity.

Next, Referring to FIG. 5C, the doped region 140 is formed in the substrate 110, the doped regions 122 and 123 are formed in the well 120, and the doped regions 132 and 133 are formed in the well 130. In one embodiment, the doped regions 140, 122, 123, 132 and 133 are formed by doping P-type dopants such as boron, gallium, aluminum, indium, or a combination thereof. The impurity concentration can be varied according to manufacturing processes and device characteristics. In this embodiment, the impurity concentrations of the doped regions 140, 122, 123, 132, and 133 are higher than the impurity concentration of the substrate 110. In one embodiment, the doped regions 140, 122, 123, 132, and 133 are formed by performing a doping process with a patterned mask (not shown). In this embodiment, the doped region 122 is disposed between the isolation regions 151 and 125, the doped region 123 is disposed between the isolation regions 125 and 126, the doped region 132 is disposed between the isolation regions 152 and 135, and the doped region 133 is disposed between the isolation regions 135 and 136.

Next, the doped region 124 is formed in the well 120, and the doped region 134 is formed in the well 130. In one embodiment, the doped regions 124 and 134 may be formed by doping N-type dopants such as phosphorus, arsenic, nitrogen, antimony, or a combination thereof. The impurity concentration can be varied according to manufacturing processes and device characteristics. In this embodiment, the impurity concentrations of the doped regions 124 and 134 are higher than the impurity concentrations of the wells 121 and 131. In one embodiment, the doped regions 124 and 134 are formed by performing a doping process with a patterned mask (not shown). In this embodiment, the doped region 124 is disposed between the isolation regions 126 and 152, and the doped region 134 is disposed between the isolation regions 136 and 153.

The doped regions 122, 123 and the well 121 constitute the PNP element 120, and the doped regions 132, 133 and the well 131 constitute the PNP element 130. Additionally, an NPN element comprising the P-type substrate (e.g., the substrate 110) occurs between the PNP elements 120 and 130. For example, the wells 121, 131 and the substrate 110 constitute an NPN element. Due to the existence of the NPN element, when the PNP elements 120 and 130 are turned on, each of the PNP elements 120 and 130 has a high holding voltage, and the resistances of the turned-on PNP elements 120 and 130 are optimized. Therefore, the PNP elements 120 and 130 can accept a high ESD current.

Unless otherwise defined, all terms (including technical and scientific terms) used herein have the same meaning as commonly understood by one of ordinary skill in the art to which this invention belongs. It will be further understood that terms such as those defined in commonly used dictionaries should be interpreted as having a meaning that is consistent with their meaning in the context of the relevant art and will not be interpreted in an idealized or overly formal sense unless expressly so defined herein.

While the disclosure has been described by way of example and in terms of the preferred embodiments, it should be understood that the disclosure is not limited to the disclosed embodiments. On the contrary, it is intended to cover various modifications and similar arrangements (as would be apparent to those skilled in the art). For example, it should be understood that the system, device and method may be realized in software, hardware, firmware, or any combination thereof. Therefore, the scope of the appended claims should be accorded the broadest interpretation so as to encompass all such modifications and similar arrangements.

What is claimed is:

1. An electrostatic discharge (ESD) protection device, comprising:
   a substrate having a P-type conductivity;
   a first PNP element comprising:

a first well formed in the substrate and having an N-type conductivity;
   a first doped region formed in the first well and having the P-type conductivity; and
   a second doped region formed in the first well and having the P-type conductivity;
   a second PNP element comprising:
   a second well formed in the substrate and having the N-type conductivity;
   a third doped region formed in the second well and having the P-type conductivity; and
   a fourth doped region formed in the second well and having the P-type conductivity;
   a first isolation region formed in the substrate and isolating the first PNP element and the second PNP element;
   a fifth doped region formed in the substrate and having the P-type conductivity; and
   a first wire electrically connected to the first and fifth doped regions.

2. The ESD protection device as claimed in claim 1, wherein the first PNP element further comprises:
   a sixth doped region formed in the first well and having the N-type conductivity;
   a second isolation region formed in the first well and disposed between the first and second doped regions; and
   a third isolation region formed in the first well and disposed between the second and sixth doped regions.

3. The ESD protection device as claimed in claim 2, wherein the second PNP element further comprises:
   a seventh doped region formed in the second well and having the N-type conductivity;
   a fourth isolation region formed in the second well and disposed between the third and fourth doped regions; and
   a fifth isolation region formed in the second well and disposed between the fourth and seventh doped regions.

4. The ESD protection device as claimed in claim 3, wherein the first isolation region extends into the first and second wells and is disposed between the third and sixth doped regions.

5. The ESD protection device as claimed in claim 3, wherein a width of the first isolation region is larger than a width of the second isolation region.

6. The ESD protection device as claimed in claim 1, further comprising:
   a second wire electrically connected to the second doped region, the third doped region and a sixth doped region; and
   a third wire electrically connected to the fourth doped region and a seventh doped region.

7. The ESD protection device as claimed in claim 6, wherein one of the first well, the second well and a third well has a different impurity concentration than another of the first, second and third wells.

8. The ESD protection device as claimed in claim 1, wherein the first well has a different impurity concentration than the second well.

9. The ESD protection device as claimed in claim 1, further comprising:
   a third PNP element comprising:
   a third well formed in the substrate and having the N-type conductivity;
   an eighth doped region formed in the third well and having the P-type conductivity;
   an ninth doped region formed in the third well and having the P-type conductivity;
   a tenth doped region formed in the third well and having the N-type conductivity;
   a sixth isolation region formed in the third well and disposed between the eighth and ninth doped regions;
   a seventh isolation region formed in the third well and disposed between the ninth and tenth doped regions; and
   an eighth isolation region formed in the substrate and extending into the second and third wells,
   wherein the eighth isolation region is disposed between the sixth doped region and an eighth doped region.

10. The ESD protection device as claimed in claim 9, further comprising:
   a fourth wire electrically connected to the ninth and tenth doped regions,
   wherein a third wire is electrically connected to the eighth doped region.

11. An ESD protection circuit comprising:
   a first PNP element comprising a first collector, a first emitter and a first base, wherein the first emitter is coupled to a first power source;
   a second PNP element comprising a second collector, a second emitter and a second base, wherein the second collector is coupled to the first emitter, and the second emitter is coupled to a second power source; and
   a first NPN element comprising a third collector, a third emitter and a third base, wherein the third collector is coupled to the second base, the third emitter is coupled to the first base, and the third base is coupled to the first power source.

12. The ESD protection circuit as claimed in claim 11, wherein in response to the ESD event occurring in the second power source and the first power source being coupled to ground, the first and second PNP elements are turned on in sequence.

13. The ESD protection circuit as claimed in claim 12, wherein in response to an ESD event occurring in the second power source and the first power source being coupled to ground, the first NPN element is turned on to reduce turn-on resistances of the first and second PNP elements.

14. The ESD protection circuit as claimed in claim 11, wherein a first equivalent impedance occurs between the first emitter and the first base, a second equivalent impedance occurs between the second emitter and the second base, and a third equivalent impedance occurs between the third base and the first power source.

15. The ESD protection circuit as claimed in claim 14, further comprising:
   a third PNP element comprising a fourth collector, a fourth emitter and a fourth base, wherein the fourth collector is coupled to the second emitter, and the fourth emitter is coupled to the second power source;
   a second NPN element comprising a fifth collector, a fifth emitter and a fifth base, wherein the fifth collector is coupled to the fourth base, the fifth emitter is coupled to the second base, and the fifth base is coupled to the first power source;
   a third NPN element comprising a sixth collector, a sixth emitter and a sixth base, wherein the sixth collector is coupled to the second power source, the sixth emitter is coupled to the first base, and the sixth base is coupled to the first power source.

16. The ESD protection circuit as claimed in claim 15, wherein in response to an ESD event occurring in the second power source and the first power source being coupled to ground, the first PNP element, the second PNP element and the third PNP element are turned on in sequence.

17. The ESD protection circuit as claimed in claim 15, wherein a fourth equivalent impedance occurs between the fourth base and the second power source, a fifth equivalent impedance occurs between the fifth base and the second power source, and a sixth equivalent impedance occurs between the sixth base and the second power source.

* * * * *